United States Patent [19]

Sugawara et al.

[11] 4,419,685

[45] Dec. 6, 1983

[54] SEMICONDUCTOR DEVICE

[75] Inventors: Yoshitaka Sugawara; Tatsuya Kamei, both of Hitachi; Tetsuma Sakurai, Hachioji, all of Japan

[73] Assignees: Hitachi, Ltd.; Nippon Telegraph & Telephone Public Corporation, both of Tokyo, Japan

[21] Appl. No.: 245,510

[22] Filed: Mar. 19, 1981

[30] Foreign Application Priority Data

Mar. 19, 1980 [JP] Japan .................................. 55/34066

[51] Int. Cl.³ ............................................ H01L 29/40
[52] U.S. Cl. ......................................... 357/53; 357/35
[58] Field of Search .............................. 357/35, 38, 53

[56] References Cited

U.S. PATENT DOCUMENTS

| 3,302,076 | 1/1967 | Kang et al. ........................... 357/53 |
| 3,919,005 | 11/1975 | Schinella .............................. 357/35 |
| 4,283,236 | 8/1981 | Sirsi .................................. 357/35 X |

Primary Examiner—Martin H. Edlow
Attorney, Agent, or Firm—Antonelli, Terry & Wands

[57] ABSTRACT

A lateral transistor having a high breakdown voltage and operable with an improved current amplification factor and an improved cut-off frequency comprises in a semiconductor substrate of one conductivity type, a base layer of the one conductivity type and an emitter layer of the other conductivity type formed in the base layer. A first collector layer of the other conductivity type is formed in the one principal surface of the substrate apart from the base layer and a second collector layer of the same conductivity type having an impurity concentration lower than that of the first collector layer is formed between the first collector layer and the base layer in contact with the latter layers. Emitter, base and collector electrodes make ohmic contact with the emitter, base and first collector layers respectively. The emitter electrode extends on a passivation film covering the one principal surface of the substrate to terminate at a point on the second collector layer.

3 Claims, 3 Drawing Figures

SEMICONDUCTOR DEVICE

The present invention relates to a semiconductor device, and more particularly to a lateral transistor having a high breakdown voltage and operable with an improved current amplification factor and an improved cut-off frequency.

A bipolar linear IC includes generally both of an npn transistor and a pnp transistor integrated therein. This is because integration of such a transistor combination provides advantages among others that the level shift and phase reversal are facilitated, the freedom of design increases and a compact circuit arrangement can be obtained. For the purpose of reducting the number of steps required for the manufacture of such an IC thereby reducing the manufacturing cost thereof, it is common practice that one of the transistors, for example, the npn transistor is integrated in the form of a vertical structure, while the other transistor, for example, the pnp transistor is integrated in the form of a lateral structure.

There is an ever increasing demand for IC's in various fields of industry in view of the recent trend of rapid electronization of various industrial apparatus, and, because of such a trend, IC's including elements exhibiting novel and greatly improved operating characteristics are now strongly demanded in various fields of industry. A linear IC capable of withstanding a high voltage, for example, is a typical example of such IC's. This linear IC requires indispensably a lateral transistor having a high breakdown voltage and operable with a greatly improved performance.

Generally, the impurity concentration of the base layer of a lateral transistor is selected to be low enough to permit spreading of a depletion layer toward and into the base layer in response to the application of a high voltage so that the collector junction can sufficiently withstand the high voltage applied across the transistor. In order to prevent the so-called punch-through phenomenon resulting from spreading of the depletion layer to the emitter junction, the width of the base layer is designed to be larger than the width of the depletion layer spreading at the designed breakdown voltage. Consequently, the current amplification factor and cut-off frequency of the lateral transistor are extremely lowered compared with those of the transistor of vertical structure.

The present invention as well as the prior art will now be described in conjunction with the accompanying drawing, in which.

Figure 1:
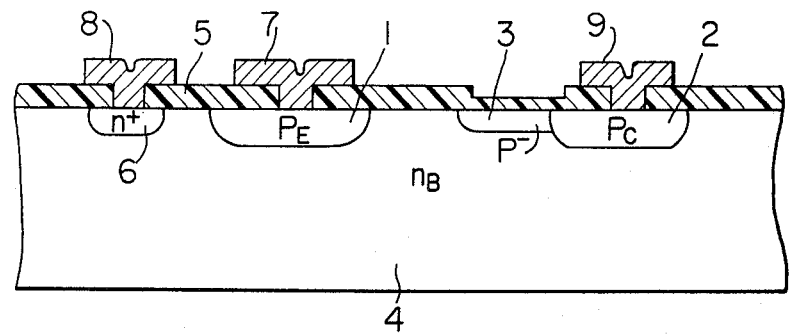
FIG. 1 is a schematic longitudinal partial sectional view showing the structure of a prior art pnp lateral transistor.

Various transistor elements of lateral structure have been proposed hitherto in an effort to obviate the above-mentioned drawback of the lateral transistor. A transistor element having a lateral structure as shown in FIG. 1 is a representative prior art example of the proposed transistor elements. Referring to FIG. 1, the element includes a $p^-$-type collector layer 3 or a low impurity concentration collector layer formed between a p-type emitter layer 1 and a p-type collector layer 2. The impurity concentration of this $p^-$-type collector layer 3 is selected to be equivalent to or slightly higher than that of an n-type base layer 4. In FIG. 1, reference numeral 5 designates a passivation or surface stabilizing film such as a film of silicon oxide, and numeral 6 designates an $n^+$-type layer which has an impurity concentration higher than that of the n-type base layer 4 and forms part of the n-type base layer 4. Numerals 7, 8 and 9 designate an emitter electrode, a base electrode and a collector electrode respectively. When a high voltage, which renders the emitter electrode 7 positive relative to the collector electrode 9, is applied to the emitter electrode 7 without applying the base signal to the base electrode 8, a depletion layer spreads uniformly not only toward the n-type base layer 4 but also toward the $p^-$-type collector layer 3. Therefore, the distance between the p-type emitter layer 1 and the $p^-$-type collector layer 3, that is, the width of the portion of the n-type base layer 4 lying between the layers 1 and 3 can be made smaller than the width of the depletion layer spreading at the designed breakdown voltage. As a result, the current amplification factor and cut-off frequency of the transistor element can be improved. In the structure shown in FIG. 1, the impurity concentration of the $p^-$-type collector layer 3 is designed to be equivalent to or slightly higher than that of the n-type substrate forming the n-type base layer 4 due to the fact that the thickness of the $p^-$-type collector layer 3 is selected to be considerably smaller than that of the n-type base layer 4. Thus, the width of the portion of the n-type base layer 4 lying between the p-type emitter layer 1 and the $p^-$-type collector layer 3 is larger than ½ of the width of the depletion layer spreading at the designed breakdown voltage. The width of the portion of the n-type base layer 4 lying between the layers 1 and 3 will be referred to hereinafter as the width of the n-type base layer 4. The width of the n-type base layer 4 must be larger than about 7 $\mu$m since the width of the depletion layer is larger than about 14 $\mu$m when the designed breakdown voltage of the transistor element is higher than 200 V. In the case of a transistor of vertical structure, the width of its n-type base layer is generally about 1 $\mu$m when the designed breakdown voltage is 200 V. Therefore, the current amplification factor and cut-off frequency of the transistor of lateral structure are considerably lower than those of the transistor of vertical structure. Hence, the transistor of lateral structure as shown in FIG. 1 is defective in that its current amplification factor and cut-off frequency are so low or only about 30 and 1 MHz respectively at the most.

Accordingly, an object of the present invention is to provide a lateral transistor having a high breakdown voltage and operable with an improved current amplification factor and an improved cut-off frequency.

Another object of the present invention is to provide a high breakdown voltage lateral transistor in which conductivity modulation can be satisfactorily attained in its collector layer.

Still another object of the present invention is to provide a lateral transistor exhibiting an improved trade-off between its withstand voltage characteristic and its current amplification factor and cut-off frequency characteistics.

The semiconductor device according to the present invention is featured by the fact that it comprises a base layer of high impurity concentration formed by diffusion of an impurity into one of the principal surfaces of a semiconductor substrate of one conductivity type, the conductivity type of the base layer being thus the same as that of the substrate, an emitter layer of the other conductivity type formed in this base layer, a first collector layer of the other conductivity type formed in a relation spaced apart from the base layer, a second collector layer of low impurity concentration and of the same conductivity type as the first collector layer, the second collector layer being formed between the base layer and the first collector layer, and an emitter electrode, a base electrode and a collector electrode making ohmic contact with the emitter layer, base layer and first collector layer respectively, the emitter electrode extending on a passivation film convering the prinicipal surface of the substrate to terminate at a point on the second collector layer of low impurity concentration.

Figure 2:
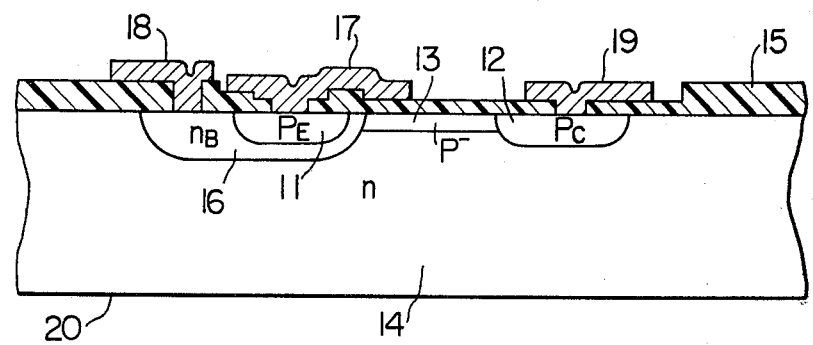
FIG. 2 is a schematic longitudinal partial sectional view showing the structure of an embodiment of the pnp lateral transistor according to the present invention.

FIG. 2 shows schematically the structure of an embodiment of the semiconductor device according to the present invention. Referring to FIG. 2, a p-type emitter layer 11 is formed in an n-type base layer 16 of high impurity concentration formed in one of the principal surfaces of an n-type substrate 14, and a $p^-$-type collector layer 13 of low impurity concentration is formed between a p-type collector layer 12 and the n-type base layer 16. A passivation or surface stabilizing film 15 covers the principal surface of the n-type substrate 14, and an emitter electrode 17 making ohmic contact with the p-type emitter layer 11 extends on the passivation film 15 to terminate at a point on the $p^-$-type collector layer 13. A base electrode 18 makes ohmic contact with the n-type base layer 16, and a collector electrode 19 makes ohmic contact with the p-type collector layer 12.

As described, the substrate 14 having the p-type emitter layer 11, n-type base layer 16 and p-type collector layer 12 formed in one of its principal surfaces is of the n-type. In the case of an IC, an island region in an insulator isolated substrate corresponds to the n-type substrate 14 shown in FIG. 2. Generally, a plurality of island regions are present in such a substrate and are isolated from a supporting region by insulating regions. In a dielectric isolated substrate, each of island regions is provided by a monocrystalline semiconductor, the insulating region is provided by a film of dielectric material such as $SiO_2$, and the supporting region is provided by a polycrystalline semiconductor. One of these island regions corresponds to the n-type substrate 14 shown in FIG. 2.

In FIG. 2, the depth of the n-type base layer 16 is about 4 μm, that of the p-type emitter layer 11 and p-type collector layer 12 is about 3 μm, and that of the $p^-$-type collector layer 13 is about 1.5 μm. The distance between the p-type emitter layer 11 and the $p^{31}$-type collector layer 13 is about 1 μm, and that between the n-type base layer 16 and the p-type collector layer 12 is about 25 μm. The surface impurity concentration of the n-type base layer 16 is about $10^{18}$ cm$^{-3}$, and the impurity concentration of the n-type substrate 14 is about $2 \times 10^{14}$ cm$^{-3}$. The $p^-$-type collector layer 13 is formed by ion implantation with the dosage of about $3 \times 10^{12}$ cm$^{-3}$.

The first embodiment of the semiconductor device according to the present invention, as shown in FIG. 2, is made by the steps described below. In a first step, the passivation oxide film 15 is formed on one of the principal surfaces of the n-type substrate 14, and the n-type base layer 16 is formed in the n-type substrate 14 by diffusing phosphorus through a diffusion opening formed in the corresponding portion of the passivation film 15 by means of a first photoetching process. In a second step, the p-type emitter layer 11 is formed in the n-type base layer 16 by diffusing boron through a diffusion opening formed by a second photoetching process in an oxide film which has been deposited during the diffusion process for the formation of the n-type base layer 16. In this second step, the p-type collector layer 12 is simultaneously formed by impurity diffusion through another diffusion opening formed by the second photoetching process in the corresponding portion of the oxide film 15. In a third step, the $p^-$-type collector layer 13 is formed by ion implantation through an opening formed by a third photoetching process in the corresponding portion of the oxide film 15 and then applying annealing and oxidizing treatment. In a fourth step, openings are formed in the oxide film portions corresponding to the positions at which the electrodes 17, 18 and 19 are to be deposited by vacuum evaporation of aluminum, and aluminum is then evaporated all over the substrate surface. In the final step, the deposited aluminum is removed by a fourth photoetching process except the electrodes 17, 18 and 19 of aluminum thereby to complete the transistor element of lateral structure. In the method of making the transistor element above described, it should be noted that the shape of the photomask used and the oxide film etching condition for the second photoetching process are so selected or controlled that the edge of the p-type emitter layer 11 opposite to the p-type collector layer 12 can be exactly positioned to align with the diffusion opening used for the formation of the n-type base layer 16. This step generally is carried out utilizing the so-called self-alignment technique. Consequently, the width of the portion of the n-type base layer 16 facing or adjoining the $p^{31}$-type collector layer 13 can be made so small that it is approximately equal to the width or thickness of the portion of the n-type base layer 16 located opposite to the other principal surface 20 of the n-type substrate 14 and underlying the p-type emitter layer 11.

The width of the portion of the n-type base layer 16 adjoining the $p^-$-type collector layer 13 is small or only about 1 μm, as described hereinbefore. Therefore, the injected carrier transfer efficiency can be increased to greatly improve the current amplification factor $h_{FE}$. Generally, the cut-off frequency of a lateral transistor is dependent upon the length of time required for the injected carriers to migrate through the base layer. Since this migration time is generally proportional to the second power of the width of the base layer, the reduction of the width of the base layer is greatly effective in shortening the migration time of the injected carriers. Therefore, the cut-off frequency can be greatly increased or improved according to the present embodiment.

Because of the fact that the impurity concentration of the n-type base layer 16 is higher than that of the n-type substrate 14 and that of the $p^-$-type collector layer 13 in the present embodiment, the depletion layer produced when a high voltage rendering the emitter electrode 17 positive relative to the collector electrode 19 is applied to the emitter electrode 17 does not spread so deep into the n-type base layer 16 in spite of the fact that the width of the n-type base layer 16 is so small or only about 1 μm. Therefore, the undesirable punch-through can be prevented from occurring up to a considerably large value of the high voltage applied to the emitter electrode 17.

In order that the lateral transistor has a high breakdown voltage, it is preferable that the impurity concentration of the p⁻-type collector layer 13 is as low as possible so that the depletion layer can spread into the p⁻-type collector layer 13 as deep as possible. On the other hand, the function of conductivity modulation in the p-type collector layer 12 is reduced when the impurity concentration of the p⁻-type collector layer 13 is too low, resulting in quasi saturation, or lowering of the cut-off frequency in the range of large collector current or an increase in the collector resistance. It is therefore desirable that the lateral transistor maintains still a high breakdown voltage even when the impurity concentration of the p⁻-type collector layer 13 is increased to ensure satisfactory conductivity modulation in the p⁻-type collector layer 13.

The above-described embodiment of the present invention can satisfy both the requirement for satisfactory conductivity modulation in the p-type collector layer 12 and the requirement for the increased breakdown voltage level, for the reasons described presently. The passivation film 15 includes positive charges in many cases. By the action of the positive charges, negative charges are attracted toward and onto the upper principal surface portion of the p⁻-type collector layer 13, and the attracted negative charges and holes in the p⁻-type collector layer 13 cancel each other. This compensating action produces a depletion layer. The higher the impurity concentration of the p⁻-type collector layer 13, the width of the spreading depletion layer is smaller. According to the present invention, however, the emitter electrode 17 is extended to partly cover the p⁻-type collector layer 13. Thus, when a high voltage is applied to the emitter electrode 17 to render the emitter electrode 17 positive relative to the collector electrode 19, more negative charges including those corresponding to the relative positive potential at the emitter electrode 17 are attracted toward the p⁻-type collector layer 13, and such negative charges and holes in the p⁻-type collector layer 13 cancel each other to produce a depletion layer which spreads also toward the upper principal surface portion of the p⁻-type collector layer 13. That is, the higher the relative potential level at the emitter electrode 17, a wider depletion layer is produced, and the breakdown voltage level can be made higher correspondingly. Thus, when the breakdown voltage level is fixed, the impurity concentration of the p⁻-type collector layer 13 can be increased correspondingly. Therefore, the impurity concentration of the p⁻-type collector layer 13 can be increased to ensure the desired function of satisfactory conductivity modulation, and, at the same time, the desired increase in the breakdown voltage level can be achieved. The effect of attracting more negative charges toward the p⁻-type collector layer 13 by the emitter electrode 17 is enhanced when the thickness of the portion of the passivation film 15 covering the p⁻-type collector layer 13 is as small as possible. The embodiment of the present invention shown in FIG. 2 is therefore advantageous for ensuring the desired satisfactory conductivity modulation and the desired high breakdown voltage level since the thickness of the portion of the passivation film 15 convering the p⁻-type collector layer 13 is selected to be smaller than that covering the n-type base layer 16 as seen in FIG. 2.

Further, the portion of the collector electrode 19 remote from the p⁻-type collector layer 13 or remote from the electrodes 17 and 18 extends on the passivation film 15 to a non-diffused portion of the n-type substrate 14 to act as a field plate as shown in FIG. 2. The field plate functions to avoid build-up of a concentrated electric field in the vicinity of the surface of the collector junction, so that the desired high breakdown voltage can be ensured.

In the case of the embodiment of the present invention shown in FIG. 2, the base-collector breakdown voltage was 300 V to 350 V, the current amplification factor $h_{FE}$ was 100 to 250, and the cut-off frequency was 40 MHz to 60 MHz. Thus, the trade-off between the breakdown voltage characteristic and the current amplification factor and cut-off frequency characteristics could be greatly improved. These characteristics were nearly equivalent to those of an npn transistor of vertical structure manufactured by the steps which were almost the same as those used for the manufacture of the pnp transistor of lateral structure. A linear IC having a high breakdown voltage and including such lateral and vertical transistors therein could be substantially freed from various restrictions imposed on prior art IC's of this kind.

It is apparent to those skilled in the art that the present invention is in no way limited to a specific embodiment as described hereinbefore, and various changes and modifications may be made.

For example, the collector breakdown voltage can be further improved by increasing the distance between the n-type base layer 16 and the p-type collector layer 12 and by selecting a suitable dosage for forming the p⁻-type collector layer 13. In an example in which the distance between the n-type base layer 16 and the p-type collector layer 12 is selected to be 55 μm, the dosage for the p⁻-type collector layer 13 is selected to be $10^{12}$ cm⁻³, and the distance between the p-type emitter layer 11 and the p⁻-type collector layer 13 (or the width of the n-type base layer 16) is selected to be about 1.4 μm, there were shown a high breakdown voltage or about 600 V, a large current amplification factor $h_{FE}$ of 80 to 120 and a high cut-off frequency of about 10 MHz.

The present invention can reduce the area occupied by the lateral transistor since the distance between the n-type base layer and the p-type collector layer can be made smaller than that of the prior art one. Thus, when the present invention is applied to a linear IC including such a high breakdown voltage lateral transistor, the effect of reducing the area occupied by the lateral transistor is so marked that the integration density of the linear IC can be greatly improved.

Figure 3:
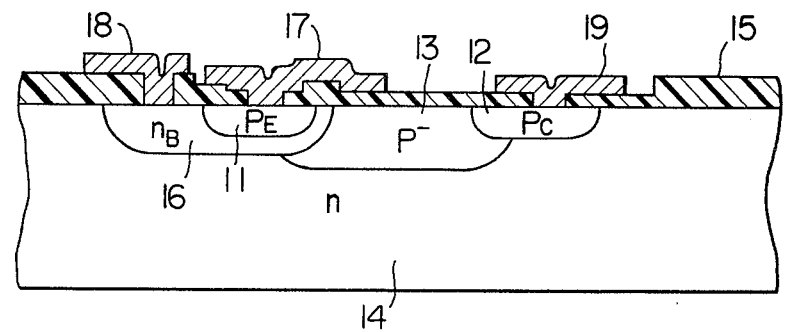
FIG. 3 is a view similar to FIG. 2 but showing the structure of another embodiment of the pnp lateral transistor according to the present invention.

FIG. 3 shows another embodiment of the present invention. The present embodiment is generally similar to the embodiment shown in FIG. 2 except the depth and impurity concentration (or impurity concentration distribution) of the p⁻-type collector layer 13. The embodiment of FIG. 3 is easily manufactured by carrying out the step of ion implantation for forming the p⁻-type collector layer 13 prior to the steps of impurity diffusion for forming the n-type base layer 16, p-type emitter layer 11 and p-type collector layer 12. This embodiment is advantageous in that the collector resistance can be reduced compared with the embodiment of FIG. 2 since the depth of the p⁻-type collector layer 13 can be made larger, for example, larger than the n-type base layer 16.

It is apparent that the present invention is also equally effectively applicable to the formation of an npn lateral transistor and a lateral thyristor and to the formation of a phototransistor and a photothyristor of lateral structure. For example, a lateral thyristor can be obtained when the p-type collector layer 12 shown in FIGS. 2 and 3 is considered to be a p-type base of the thyristor and an n-type impurity is diffused into this p-type base to form an n-type emitter layer therein.

What is claimed is:

1. A semiconductor device comprising:

(a) a semiconductor substrate of a first conductivity type including a first semiconductor region of said first conductivity type exposed to one of the principal surfaces of said semiconductor substrate, said first semiconductor region having an impurity concentration higher than that of said semiconductor substrate, a second semiconductor region of a second conductivity type formed in said first semiconductor region to be exposed to said one principal surface, a third semiconductor region of said second conductivity type formed at a position spaced apart from said first semiconductor region to be exposed at said one principal surface, and a fourth semiconductor region of said second conductivity type formed between said first and third semiconductor regions to make contact therewith and to be exposed to said one principal surface, said fourth semiconductor region having an impurity concentration lower than that of said third semiconductor region;

(b) a passivation film covering said one principal surface of said semiconductor substrate; and (c) first, second and third electrodes making ohmic contact with said first, second and third semiconductor regions through openings in said passivation film, respectively, said second electrode extending on said passivation film beyond a portion of said first semiconductor region between said second and fourth semiconductor regions and to a point on said passivation film under which said fourth semiconductor region exists, said first electrode being in ohmic contact with said first semiconductor region at a portion thereof remote from said fourth semiconductor region, and a portion of said third electrode remote from said first and second electrodes extending to a point on said passivation film under which said semiconductor substrate is exposed.

2. A semiconductor device as claimed in claim 1, wherein the portion of said passivation film covering said fourth semiconductor region has a thickness smaller than that covering said first semiconductor region.

3. A semiconductor device as claimed in claim 1, wherein said fourth semiconductor region has a depth larger than that of said first semiconductor region.

* * * * *